(12) United States Patent
McFarland et al.

(10) Patent No.: US 7,027,530 B2
(45) Date of Patent: Apr. 11, 2006

(54) METHOD AND APPARATUS FOR MAXIMIZING RECEIVER PERFORMANCE UTILIZING MID-PACKET GAIN CHANGES

(75) Inventors: William McFarland, Los Altos, CA (US); Teresa H. Meng, Portola Valley, CA (US); Paul J. Husted, Los Altos, CA (US); John S. Thomson, Santa Clara, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 818 days.

(21) Appl. No.: 09/833,749

(22) Filed: Apr. 11, 2001

(65) Prior Publication Data
US 2002/0186796 A1   Dec. 12, 2002

(51) Int. Cl.
*H04L 27/06* (2006.01)
(52) U.S. Cl. .................. 375/341; 375/345; 375/262; 455/219; 330/254; 714/794; 714/795
(58) Field of Classification Search ............ 375/341, 375/137, 355, 316, 340, 345, 260, 343, 365, 375/346, 368, 231, 324, 347, 130, 262; 370/481, 370/491, 208, 203, 487; 330/254; 455/219; 714/794, 795
See application file for complete search history.

(56) References Cited

U.S. PATENT DOCUMENTS

| 5,812,523 | A | * | 9/1998 | Isaksson et al. | 370/208 |
| 6,009,129 | A | * | 12/1999 | Kenney et al. | 375/346 |
| 6,188,717 | B1 | | 2/2001 | Kaiser et al. | 375/148 |
| 6,192,070 | B1 | | 2/2001 | Poon et al. | 375/222 |
| 6,392,570 | B1 | | 5/2002 | Bucht | 341/59 |
| 6,456,670 | B1 | * | 9/2002 | Kindler et al. | 375/316 |
| 6,549,561 | B1 | * | 4/2003 | Crawford | 375/137 |
| 6,711,221 | B1 | * | 3/2004 | Belotserkovsky et al. | 375/355 |
| 2002/0094050 | A1 | * | 7/2002 | Usui et al. | 375/368 |

FOREIGN PATENT DOCUMENTS

WO    WO 99/21287    4/1999

* cited by examiner

*Primary Examiner*—Stephen Chin
*Assistant Examiner*—Ted Wang
(74) *Attorney, Agent, or Firm*—Bever, Hoffman & Harms, LLP; Jeanette S. Harms (57) ABSTRACT

The present invention provides a method of and an apparatus for changing the gain of a receive path amplifier during the middle of a packet transmission, and particularly changing the gain during a guard interval between a symbol with encoding bits disposed therein and a subsequent data symbol encoded in a manner corresponding to the encoding bits.

80 Claims, 3 Drawing Sheets

METHOD AND APPARATUS FOR MAXIMIZING RECEIVER PERFORMANCE UTILIZING MID-PACKET GAIN CHANGES

FIELD OF THE INVENTION

The present invention relates to a method of and apparatus for mid-packet changing of the gain of a receive path amplifier.

BACKGROUND OF THE RELATED ART

In a communication system, transceivers are electronic devices that include receivers that receive incoming signals and transmitters that transmit outgoing signals, and are very well known.

Certain types of digital receivers have the ability to receive incoming signals that are transmitted with different modulation schemes, also known as multi-rate modulation schemes. Thus, a single receiver can, at different times, receive signals that have been modulated in, for instance, a binary phase shift key (BPSK) modulation format or a quadrature amplitude modulation (QAM) format. Generally, it is advantageous to use a more complex modulation scheme if possible, since more information can be communicated for a given bandwidth using a modulation scheme that is more complex. But which modulation scheme to use at different times can depend on various criteria. For instance, when a communication channel is good, the transmitter may try to transmit at a high data rate with a complex modulation, such as 64 QAM, but when the channel is poor, a lower data rate with a less complex modulation, such as BPSK, may be used. When switching between modulation formats, the transmitter will commonly include a header that is modulated using the lower data rate modulation scheme. This header will typically also include an indication of the modulation used for the rest of the packet. When received at the receiver, this lowest common denominator signal at the lower data rate can, with assurances, be detected and demodulated.

Related to the type of modulation scheme that is employed are the concepts of gain and signal to noise ratio (SNR). In the receive path, gain is the term used to refer to the amplification that is applied to the incoming signal. And the SNR refers to the ratio of the incoming signal to the noise that is present in the receive path of the circuit due to components therein, such as amplifiers and mixers.

Most receivers include programmable gain in the receive path, since during the usage of the receivers, changes in the channel, circuit characteristics and the like will cause the need for a different gain at different times. Accordingly, the programmable gain is used to optimize the scaling of the received signals within the dynamic range of the receiver. For example, if the gain is set too low, noise from the various amplifiers and mixers in the receive chain will be significant compared to the size of the desired signal, and will thereby degrade performance. On the other hand, if the gain is set too high, the desired signal, or undesired signals in nearby frequency channels will cause the amplifiers and mixers to clip or saturate. The resulting non-linear behavior of these active circuits would degrade the performance of the communication system.

It is, therefore, important to optimize the gain, and thus the signal scaling, at all times in the receive chain. The optimum signal sizing is just large enough to insure that any circuit noise remains small enough relative to the signal size that successful communication can be maintained. By keeping the gain at this lowest allowable level, potentially interfering signals are allowed to be as large as possible without causing the active circuits to saturate.

In order to optimize the gain, and thus the signal scaling that is appropriate for a given packet, the minimum acceptable SNR can be calculated, simulated, or found from experimental measurements, and then used to determine the gain. And the required SNR depends on the complexity of the signal being transmitted. For example, modulation schemes that use more complex constellations, such as 64-QAM, require higher SNR.

When transmitting signals when using a multi-carrier modulation format, such as Orthogonal Frequency Division Multiplexing (OFDM) and Discrete Multi-Tone (DMT), there are included intervals when no information is being transmitted, which intervals are expressed as guard times or guard intervals. A guard time exists between each of the transmitted symbols, and is long enough to span the time of the multi-path echoes that will occur in the channel. In the receiver, these guard times are intentionally ignored, so that the multi-path echoes do not corrupt the decoding of the data. As will be described hereinafter, these guard periods present an opportunity to adjust the gain in the receiver, without causing data loss due to the temporary disruptions that occur when the gain is changed. There are also other times when it may be appropriate to adjust the gain in the receiver, such as when padding bits are being transmitted. Because the modulation type may change in the middle of a packet (at least after the header), scaling the signal to its optimum level is challenging. Since the receiver does not know the modulation format, and thus the data rate of the body of the packet, immediately, it cannot know the optimum scaling to use at the beginning of the packet. Therefore, the receiver must be conservative and size the signal large enough so that even if the most complex modulation is used later in the packet, sufficient SNR will exist so that it is received correctly. While this signal sizing will prove correct if the packet really does contain data modulated in the most complex way, if the packet contains data that is modulated in a less complex way, then that signal sizing will have been larger than necessary, and sacrifice potential ability to withstand interference. In setting the signal size, consideration must be given to the worst-case power back-off due to the blocker power.

An example of multi-modulation format signals are the signals associated with the IEEE 802.11a standard or Hiperlan II standard, which each allow for high-speed local area network communications in the 5 GHz communications band. The signal in the 802.11a standard is allocated into one of twelve different 20 MHz channels. Each of the eight channels is divided into 52 different sub-channels or carriers, of which 48 carriers are able to transmit the signal and 4 of the carriers are used to transmit pilot tones. During transmission, the signal is spread onto each of the 48 carriers associated with the channel according to the modulation scheme used, and, upon receipt, is despread and demodulated to regain the originally transmitted signal.

Figure 1:
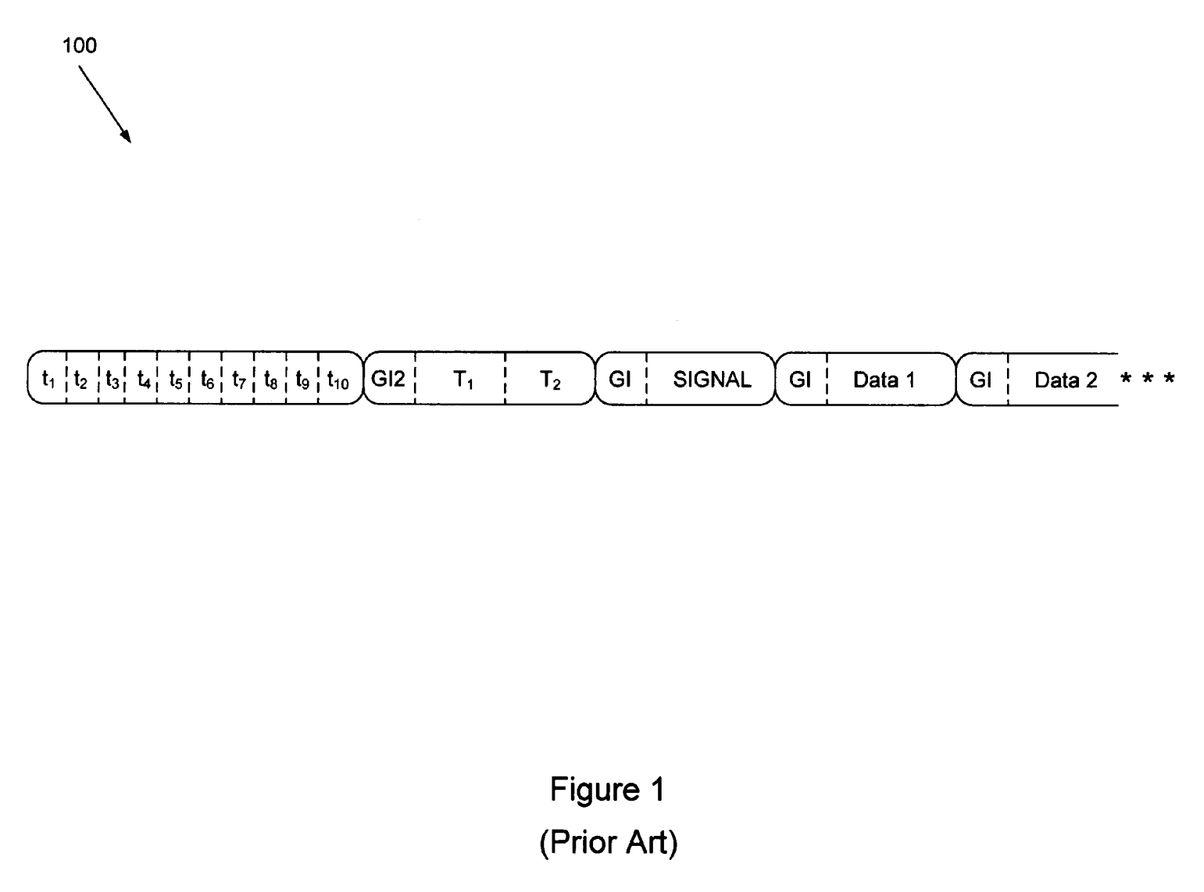
FIG. 1 illustrates a data packet used conventionally and in accordance with a preferred embodiment of the invention.

FIG. 1 illustrates the beginning portion of a packet for such an OFDM signal 100, which includes ten short training symbols t1–t10, which are identical to each other and used for signal detection, an initial automatic gain control adjustment, diversity selection, coarse frequency offset estimation and timing synchronization. Two long training symbols T1 and T2 that are also identical to each other are typically used for channel and fine frequency offset estimation. Thereafter exists the SIGNAL symbol, which corresponds to the header referred to above, that contains information indicating the data rate at which the following data, illustrated as Data 1, Data 2, . . . , for the remainder of the packet, will be transmitted. In the 802.11a standard, for each different data rate there is a different modulation scheme, which results in a one-to-one correspondence between the data rate and modulation scheme.

Figure 2:
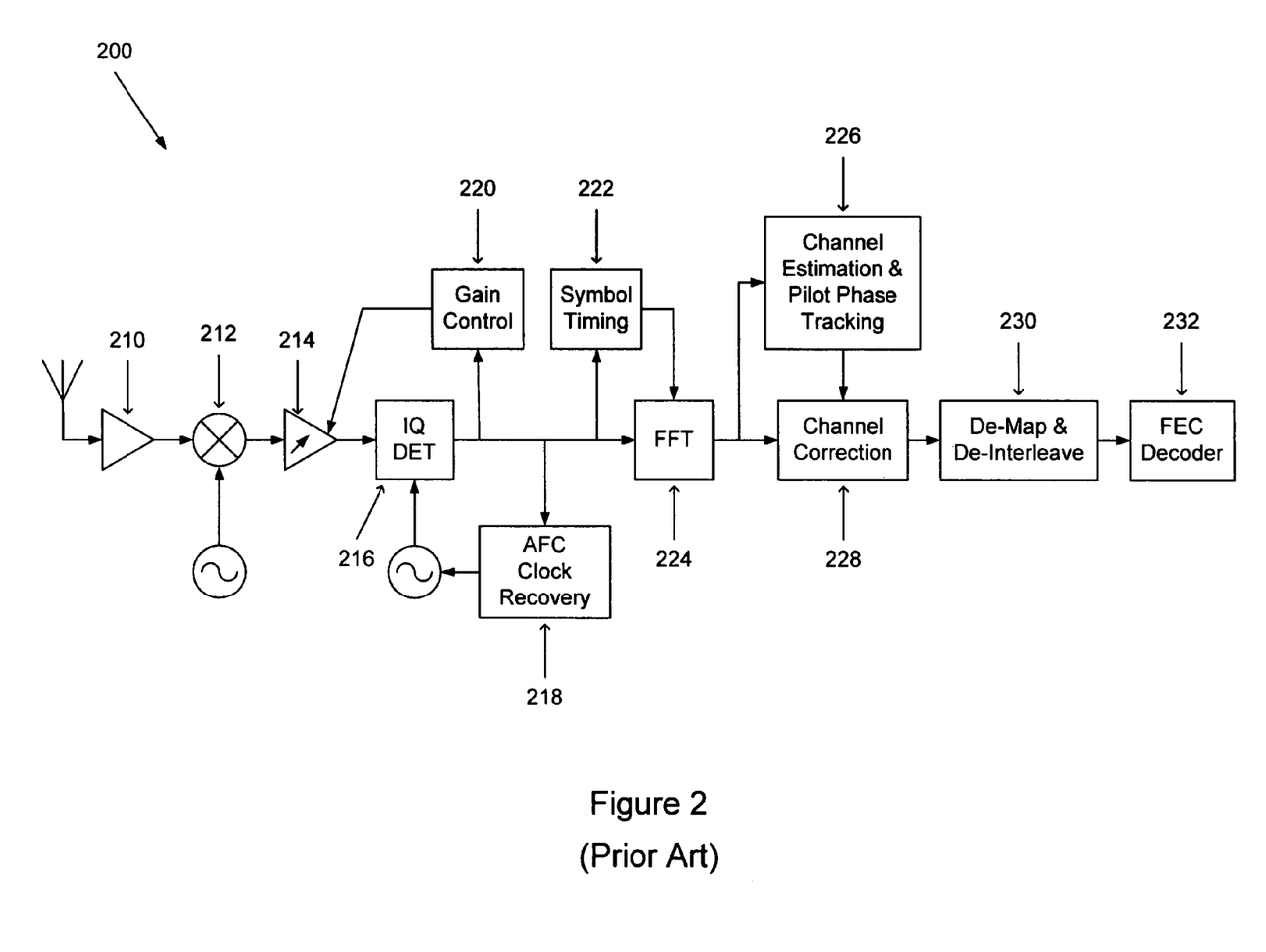
FIG. 2 illustrates a block diagram of a conventional receiver.

FIG. 2 illustrates a functional block diagram of a conventional receiver 200 that can be used to receive the signal 100 illustrated in FIG. 1. As illustrated, the receiver block includes a low noise amplifier 210, which provides an initial amplification to the received signal. Mixer 212 and automatic gain control amplifier and radio frequency level detect circuit 214 then downconvert the RF signal, typically through both an IF and then to baseband, and amplify the signal at each stage based upon a determined appropriate gain, in part based upon estimates of the in-band power of the signal. Typically the various analog gain stages are automatically controlled through digital signals, and many power estimation algorithms exist that can provide these gain settings. An IQ detector 216, in conjunction with an AFC clock recovery circuit 218, will detect the I and Q phases of the baseband signal. Gain control circuit 220 detects the magnitude of the I and Q phases of the detected baseband signal output from the IQ detector 216 during the short training symbol sequence thereof and uses the detected magnitude to adjust the gain of the gain control amplifier 214. A symbol timing circuit 222 also receives the output of the IQ detector 216, and determines those intervals during which an actual symbol exists, rather than a guard interval, and provides a timing output to the fast Fourier transform (FFT) circuit 224, which also receives the output of the IQ detector 216, and causes FFT 224 to be gated in time to receive the signal data, rather than noise caused by interference that will exist during a guard interval. The output of the FFT 224 is provided to a channel estimation and pilot phase tracking circuit 226, and a channel correction circuit 228.

The channel estimator within the channel estimation and pilot phase tracking circuit 226 obtains a channel estimate during the long training symbol sequence, and provides that channel estimate to the channel correction circuit 228. That channel estimate is then used by the channel correction circuit 228 to compensate for the determined channel characteristics for the rest of the packet. And, if included in circuit 226, a pilot phase tracker will adjust the channel estimate based upon channel information obtained by tracking pilot tones during the transmission of the rest of the packet. The channel corrected signal is then input to the de-mapping and de-interleaving circuit 230, and the forward error correction (FEC) decoder 232, typically a Viterbi decoder. The circuit 230 and the decoder 232 together decode the signal, in a conventional manner. In such a conventional receiver 200, as illustrated, the information in the packet, including the information contained in the SIGNAL symbol, is not available until the FEC decoder 232 has completed its operation, which will not occur until after quite a bit of data, as represented by Data 1, Data 2 . . . , has already been received and amplified by the gain control amplifier 214.

In operation of a conventional receiver of this type, the gain used by the automatic gain control amplifier of circuit 214 is initially determined during the initial short symbol training sequence, and then kept constant for the remainder of the packet. Thus, since the gain is held constant thereafter, it must be maintained at a level that allows the sizing of the received symbols to be large enough such that even if the most complex modulation is used in later symbols in the packet, sufficient SNR will exist so that it is received correctly, as described above.

Other types of receivers operate by continuously varying the gain to insure that whatever signals are coming in do not overload the receiver. This has at least two disadvantages in a packet-based communication system. First, the undesired signals may come and go abruptly in a packet-based system, and by the time they are detected, the desired packet may already be ruined. Second, since it is necessary to change the gain almost immediately to prevent such overload, the gain might need to be changed in the middle of a symbol. But changing the gain in the middle of a symbol can cause data to be ruined due to the change in signal magnitude and/or phase.

Accordingly, another method to control the timing of gain changes is needed, particularly when the modulation scheme changes within a given packet.

SUMMARY OF THE INVENTION

It is an object of the present invention to provide for improved signal reception using a mid-packet gain change.

It is another object of the present invention to improve the blocker rejection capability of a receiver.

It is a further object of the present invention to implement gain changes during a guard interval or some other break in data transmission.

It is a further object of the present invention to implement a mid-packet gain change based upon a decoded portion of a data identifying symbol.

It is still a further object of the present invention to implement a mid-packet gain change during a single guard interval that exists between a data identifying symbol and subsequent data symbol.

The above objects of the present invention, among others, either singly or in combination, are achieved by the present invention, which provides a method of and an apparatus for changing the gain of a receive path amplifier during the middle of a packet transmission. The methods and apparatus described operate upon a received data packet containing a plurality of symbols, with at least one of the symbols including encoding bits disposed therein and at least one subsequent data symbol encoded in a manner corresponding to the encoding bits of the symbol. In a preferred embodiment, a single guard interval is disposed between the one symbol and the subsequent data symbol, and any gain changes take place during this guard interval.

According to one aspect of the present invention, there is described a method that locates the one symbol and decodes the encoding bits of the one symbol. Thereafter, the gain of the receive path amplifier is set to correspond to an appropriate gain that is determined in part based upon the encoding bits. Once determined, the appropriate gain is applied to the variable gain amplifier, so that the at least one subsequent data symbol is amplified with the appropriate gain.

In another aspect of the present invention, there is described a variable gain amplifier that amplifies each symbol in the packet with a determined gain. A first decoder decodes the encoding bits within the one symbol. A variable gain control circuit determines an appropriate gain for the at least one subsequent data symbol based upon the detected encoding bits, and applies that gain to the variable gain amplifier for the at least one subsequent data symbol. And a second decoder decodes the at least one subsequent data symbol.

In yet another aspect of the present invention, there is described a method of adjusting the gain of a variable gain amplifier in a receive path of a receiver during a guard interval that exists between a data identifying symbol and at least one subsequent data symbol. In this method, an initial gain is determined based upon training symbols. An updated gain is then determined based upon decoding of at least a portion of the data identifying symbol. Thereafter, the updated gain is applied to the variable gain amplifier prior to the end of the single guard interval disposed between the data identifying symbol and the at least one subsequent data symbol.

Each aspect of the invention is more fully described hereinafter, and particularly in the appended claims.

BRIEF DESCRIPTION OF THE DRAWINGS

The above and other objects, features, and advantages of the present invention are further described in the detailed description which follows, with reference to the drawings by way of non-limiting exemplary embodiments of the present invention, wherein like reference numerals represent similar parts of the present invention throughout several views and wherein.

DETAILED DESCRIPTION OF THE PREFERRED EMBODIMENT

The present invention, in a preferred embodiment, operates upon an OFDM signal 100 such as described previously with respect to FIG. 1 that operates according to the 802.11 (a) standard, and as such the description of the invention provided hereinafter will be made in that context. It is understood, however, that the present invention can operate upon any signals that would benefit from the mid-packet gain adjustment described herein.

According to the present invention, automatic gain control is further enhanced to improve the blocker rejection capability of the receiver. Since the receiver has no information of the packet data rate during the initial automatic gain control operation that takes place during the short training symbol sequence, as described above, the present invention assumes a certain amount of power back-off due to the blocker power, as explained earlier. As, however, the data rate in a received packet increases, the blocker specification becomes more relaxed. For example, if the packet data rate is high, such as using 64-QAM, a much higher signal-to-noise ratio would be required for reliable detection, compared to that of lower data-rate packets. Backing off the worst case blocker specification for all packets will penalize the high data-rate packets, as analog to digital converter quantization noise may be too high for correction detection. It is in this situation that a change of gain in mid-packet can be used to increase receiver performance. In particular, once the actual data rate of the received packet is determined, that actual data rate can be used to provide for a change of gain in mid-packet, if necessary.

In the preferred embodiment, the OFDM signal includes the SIGNAL symbol illustrated in FIG. 1 that is the header at the beginning of a packet, and is BPSK modulated with rate=1/2 coding, and which contains three encoding bits out of the 24-bit SIGNAL symbol indicating which one of eight different transmission rates the following data symbols are transmitted at. The eight different transmission rates according to the present invention based upon the 802.11a standard, as discussed above, and are identified in Table 1 below.

TABLE 1

| | |
|---|---|
| 0 | 6 MB |
| 1 | 9 MB |
| 2 | 12 MB |
| 3 | 18 MB |
| 4 | 24 MB |
| 5 | 36 MB |
| 6 | 48 MB |
| 7 | 54 MB |

Accordingly, in the present invention, the automatic gain control circuit will initially assume that each packet is transmitted with the lowest modulation rate, and have gain settings corresponding thereto, and then, if necessary, change the receiver gain setting after the data rate information becomes available.

In order to operate most efficiently, according to the present invention, a changed gain settings needs to take place prior to the reception of the initial data symbol. Accordingly, decoding the date rate in the header prior to the reception of the initial data symbol requires an extra fast receiver/decoder in parallel with the main receiver chain. Once the required three bits of SIGNAL information is decoded, another gain setting, if needed, is set and is used for the rest of the packet. This other gain setting should preferably settle within the duration of the guard time between the header containing the SIGNAL information and the first of the data symbols.

The following more detailed description sets forth how the present invention implements the above mid-packet gain change.

Referring to FIG. 1, while guard bands GI2 and GI that are adjacent the long training symbols T1 and T2 are used by the present invention for their ordinary purposes, the guard band GI between the SIGNAL symbol and the first data symbol Data 1 is advantageously used by the present invention as a period during which the gain can be changed, if needed, prior to the receipt of the first data symbol.

Figure 3:
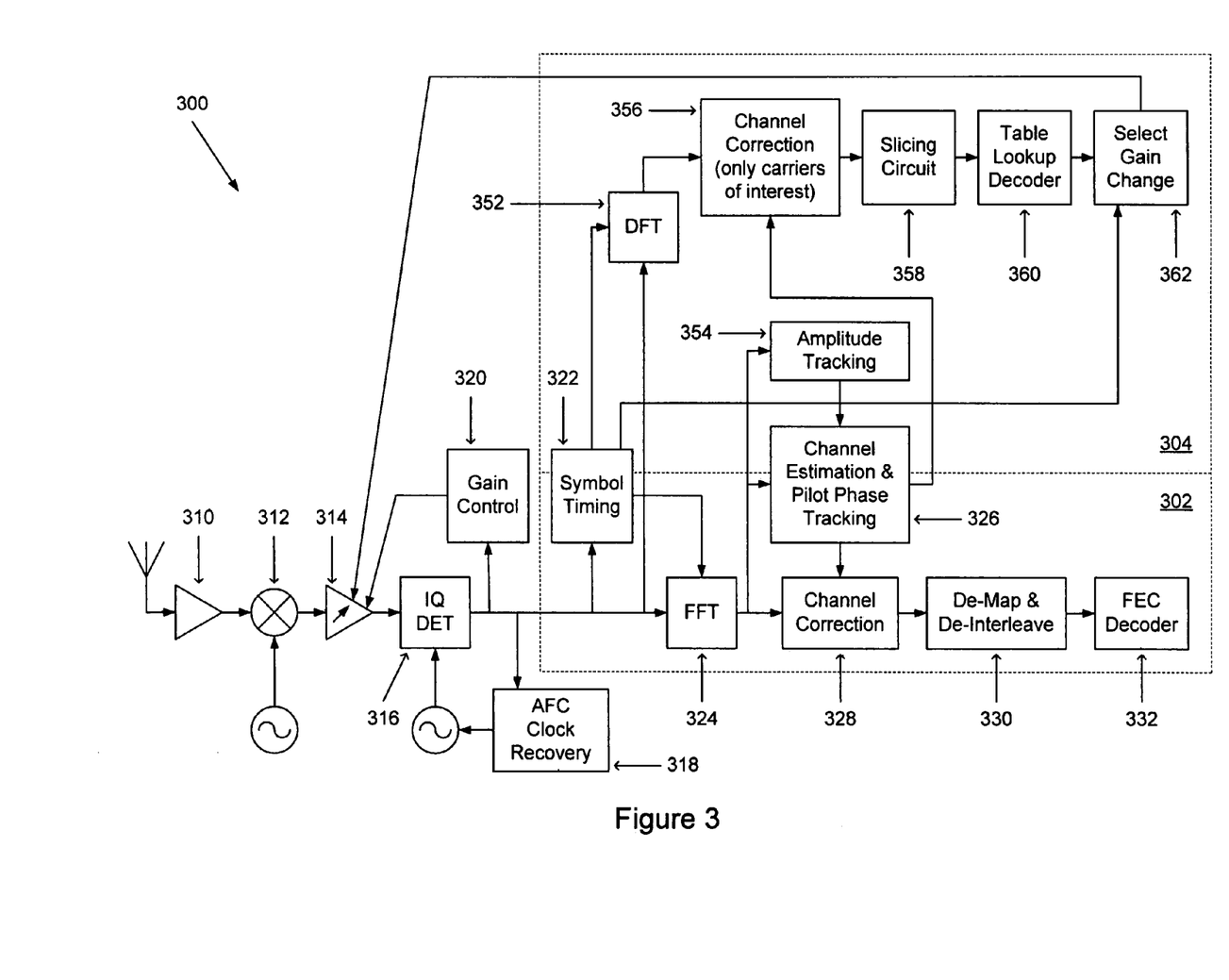
FIG. 3 illustrates a block diagram of a receiver according to a preferred embodiment of the present invention.

FIG. 3 illustrates a block diagram of a receiver 300 according to the present invention in order to implement the mid-packet gain change according to the present invention. The receiver 300 contains, for descriptive purposes as used herein, a conventional signal detection block 302 and an early signal detection block 304. It is understood, however, that the circuit within the blocks 302 and 304 need not perform exclusively for blocks 302 and 304, as will become apparent hereinafter. For context, also illustrated are a low noise amplifier 310, mixer 312, automatic gain control amplifier 314, IQ detector 316, AFC clock recovery circuit 318, and gain control circuit 320, each of which perform conventional functions and need not, therefore, be further discussed. Also, the conventional signal detection block 302 preferably includes a symbol timing circuit 322, a fast Fourier transform (FFT) circuit 324, a channel estimation and pilot phase tracking circuit 326, a channel correction circuit 328, a de-mapping and interleaving circuit 330, and a Viterbi decoder 332, which operate as discussed previously.

When early signal detection according to the present invention is implemented, however, the signal timing circuit 322 is modified as discussed further hereinafter, and the output of the channel estimation and pilot phase tracking circuit 326 is also used in the manner described herein, and as such as illustrated as being associated with both the conventional signal detection block 302 and an early signal detection block 304.

The early signal detection block 304 is used to quickly locate and decode the needed three bits from the SIGNAL symbol, which bits identify the data rate of the subsequently transmitted data, as described further hereinafter. From the identified bits, a determination is made whether the gain setting needs to change based upon the contents of the SIGNAL symbol, and this change in the gain setting is implemented if it is determined that the gain needs to change, as described further hereinafter.

FIG. 3 also illustrates a more detailed functional block diagram of the early signal detection block 304, which includes symbol timing circuit 322, discrete Fourier transform circuit (DFT) 352, amplitude tracking circuit 354, channel correction circuit 356, slicing circuit 358, decoder lookup table 360, and select gain change circuit 362.

In operation, the symbol timing circuit 322 keeps track of the time that has elapsed since the beginning of the signal 100 in order to determine when to trigger the DFT circuit 352 to input the SIGNAL symbol. Since the SIGNAL symbol will occur at the same time in every packet, keeping track of the time allows the DFT circuit 352 to input the (still modulated) SIGNAL symbol. The symbol timing circuit 322 operates using a short cyclic recognition circuit of conventional design that detects the existence of the short training symbols. When the repetition ends (taking into consideration multi-path echoes and the like), it is assumed that the signal 100 is at the end of the short training sequence. From that point, the symbol timing circuit 322 waits a period of time corresponding to the long training symbols and the guard intervals that will occur before the SIGNAL symbol is transmitted and then generates a pulse or other signal to the DFT circuit 352 indicating that it should begin obtaining samples of the signal 100, which samples will correspond to the SIGNAL symbol. It is noted that this pulse will also correspond to the pulse applied to the FFT 324 for the SIGNAL symbol. At the reception of the pulse, the DFT circuit 352 obtains samples of each of the three bits of SIGNAL data, and calculates a discrete Fourier transform for each of the six frequencies on which the SIGNAL symbol has been spread, which are known to be at the −26, −23, −19, −16, −13, and −10 bins that correspond to these frequencies on a −32 to 31 scale in an IEEE 802.11a system.

These frequencies contain the encoded rate=½, three-bit (allowing for identification of each of the eight different rates) rate field from the SIGNAL symbol. Each of the six DFT outputs from the DFT 352 are complex values containing a magnitude and a phase, as is known. At the same time, the FFT 324 also samples the SIGNAL symbol.

For both the DFT 352 and the FFT 324, it is noted that samples at the end of the guard interval may be used, and that the last few samples of the symbol may not be used, depending on the time alignment of the peak of the impulse response of the aggregate channel response and filter response. This choice of sampling is then preferably used for all symbols, and the delay in time creates a linear phase across the frequencies. Timing is maintained by adjusting a phase slope in frequency (same as a delay in time) within a given range. The six DFT outputs of the DFT 352 are then input to the channel correction circuit 356, which performs channel correction on the six DFT outputs, based upon the channel estimation obtained from the channel estimator within the channel estimation and pilot phase tracking circuit 326.

Channel correction circuit 356 operates by multiplying the six different outputs from DFT circuit 352 with the appropriate inverted channel estimate obtained from the channel estimator within channel estimation and pilot phase tracking circuit 326. The inverted channel estimate is obtained based upon the training symbols previously received, as has been described. Since the training symbols are transmitted at unity magnitude and zero phase, as discussed above, the effect of the airwaves over which the signal has been transmitted on the magnitude and phase of the training symbols can be determined, and this effect then inverted and applied to each of the six different outputs from circuit 356 to obtain six different channel corrected complex numbers representing the outputs.

Each of the six different channel corrected and normalized complex numbers is then sliced to determine if it corresponds to a digital "1" or a digital "0" by a slicing circuit 358. Since it is known that the SIGNAL symbol is BPSK modulated, only the sign of the real portion of these six different complex numbers are needed to obtain the decoded SIGNAL symbol, since whether each BPSK encoded bit is positive or negative (corresponding to a "0" or "1", respectively) can be determined from looking at only the sign of the real portion of the complex number. If the sign if positive, then that bit is a "0", and if the sign is negative, then that bit is "1." Accordingly, based upon the sign from the real portion of each of these six numbers, which one of the eight possible transmission rates that the remaining data symbols within the packet are transmitted at can be determined. Slicing circuits that perform as described are well known.

The decoder lookup table 360 receives the sign of each of the six numbers, with, for the example herein, 0=positive and 1=negative, and determines the one out of the 64 possible combinations of those six numbers (identified in the Table 2 below by as (sign0, sign1, sign2, sign3, sign4, sign5)) that results in one of the eight different rates the following data symbols are encoded at.

TABLE 2

| | | | |
|---|---|---|---|
| 000000:4  | 010000:2  | 100000:2  | 110000:2   |
| 000001:0  | 010001:3  | 100001:3  | 110001:3*  |
| 000010:1  | 010010:2  | 100010:2  | 110010:2*  |
| 000011:5  | 010011:2  | 100011:2  | 110011:2   |
| 000100:0  | 010100:0  | 100100:0  | 110100:7   |
| 000101:0* | 010101:0  | 100101:0  | 110101:3   |
| 000110:1* | 010110:1  | 100110:1  | 110110:2   |
| 000111:0  | 010111:0  | 100111:0  | 110111:6   |
| 001000:4* | 011000:4  | 101000:4  | 111000:7   |
| 001001:4  | 011001:3  | 101001:3  | 111001:3   |
| 001010:4  | 011010:2  | 101010:2  | 111010:2   |
| 001011:5* | 011011:5  | 101011:5  | 111011:6   |
| 001100:4  | 011100:7  | 101100:7  | 111100:7*  |
| 001101:0  | 011101:0  | 101101:0  | 111101:6   |
| 001110:1  | 011110:1  | 101110:1  | 111110:6   |
| 001111:5  | 011111:6  | 101111:6  | 111111:6*  |

The table values are a function of the convolutional encoder used in the 802.11a specification, and the eight values that correspond to the eight ideal data rates within an 802.11a system are identified above with an asterisk (*) If a different signal having a different error encoding is used, a corresponding maximum likelihood decoder table based upon the error encoding used can easily be constructed.

With respect to the above table, it should be noted that an error in more than one of the detected signs is needed in order to produce an incorrect result. Thus, even if signal degradation occurs for some reason, the present invention will still be able to properly identify the data rate encoded into the SIGNAL symbol.

It is also noted that a complex phase correction of the normalized result obtained by the channel correction circuit 356 can also occur if samples were obtained that include the guard interval and a timing backoff parameter was used to determine which of the samples identify the symbol. For example, if 80 samples were taken in the embodiment described above, 16 will represent the guard interval. The timing backoff parameter will indicate where within the 80 samples is the first sample that does not correspond to the guard interval, which can be determined using conventional techniques.

Based upon which one of the eight different data rates is selected, the select gain change circuit 362 will determine what the appropriate gain for that data-rate should be. In a preferred embodiment of the invention, approximately half of the short training symbols are used to initially adjust the gain based upon the channel conditions for the BPSK symbol. The present invention uses the already determined gain and modifies it based upon the determined data rate/modulation type.

In the preferred embodiment of the invention, which operates upon a signal that has been transmitted according to the IEEE 802.11a specification, as soon as the gain for the appropriate data rate/modulation type is determined, the gain is changed, since when the determination is made, the receiver 300 will be inputting data corresponding to the guard interval between the SIGNAL symbol and the first data symbol. In other systems, where there may be several symbols between the equivalent of the SIGNAL symbol and the first data symbol, the automatic gain control amplifier should preferably still have its gain changed during a guard interval. Accordingly, this is illustrated in FIG. 3 by the signal line from the symbol timing circuit 322 to the select gain change circuit 362, which will transmit an appropriate pulse aligned with the beginning of a guard interval indicating that the gain should be changed at that time.

Because the gain is being changed within the packet, the channel estimate must be adjusted to account for the change in the size of the signal due to the gain change. A pilot amplitude tracking circuit (354) is added to determine the magnitude of the received signal by summing the power of the pilot tones. This sum is used to scale the channel estimate on a symbol by symbol basis. This tracking is begun during the long training symbol and continued for the duration of the packet. Therefore any change in signal size due to the gain change is automatically compensated for by the applied channel correction. For each subsequent packet that is received, the same operations and circuits as described above are used. Since there is some likelihood that the data in a subsequent packet will have the same data rate as the previous packet, this likelihood could be used, if desired, as a default for the data rate in a packet for which, for some reason, there has been difficulty in decoding the data rate within the SIGNAL symbol within the desired amount of time.

Since according to the preferred signal type of the present invention there is a one-to-one correspondence between the data rate and the modulation type, identifying the data rate also provides the type of modulation used. If the signal type does not have this one-to-one correspondence, then the present invention can still be used, but then it is understood that the data rate but not the modulation type, will have been identified, unless steps are taken to decode bits which exist that identify the data rate and the bits which exist that identify the modulation type.

While the present invention has been described herein with reference to particular embodiments thereof, a latitude of modification, various changes and substitutions are intended in the foregoing disclosure. For example, although the mid-packet gain change has been described as occurring only once per packet, there may be requirements that would benefit from having the gain changed more then once. Also, while the present invention as described quickly decodes a small number of bits used to identify the data rate of subsequent data symbols, other bits which may need to be quickly identified, for reasons unrelated to gain, can also be decoded in a similar manner. Further, the same decoder can be used to decode the encoded bits as well as the subsequent data. And still furthermore, the encoding bits that identify the subsequent data symbol need not be within the same symbol, but can be dispersed among various symbols, which various symbols may or may not be consecutive. It will thus be appreciated that in some instances some features of the invention will be employed without a corresponding use of other features without departing from the spirit and scope of the invention as set forth in the appended claims.

We claim:

1. A method of changing the gain of a receive path amplifier in a digital receiver that operates upon a received data packet containing a plurality of symbols, at least one of the symbols including encoding bits disposed therein and at least one subsequent data symbol encoded in a manner corresponding to the encoding bits of the symbol, the method comprising the steps of:
   locating the one symbol;
   decoding the encoding bits of the one symbol, wherein the encoding bits include less than all bits that make up the one symbol;
   setting the gain of the receive path amplifier to correspond to an appropriate gain that is determined in part based upon the encoding bits; and
   amplifying the at least one subsequent data symbol with the appropriate gain.

2. The method according to claim 1 wherein:
   the one symbol and at least one subsequent data symbol are separated by only a single guard interval; and
   the step of setting the gain takes place prior to amplifying the at least one subsequent data symbol.

3. The method according to claim 1 wherein the step of decoding decodes only the encoding bits within the one symbol.

4. The method according to claim 1 wherein the step of locating the one symbol comprises the steps of:
   searching for an endpoint of a cyclic pattern of training symbols within the received data packet which precede the one symbol; and
   waiting a predetermined period of time after the endpoint.

5. The method according to claim 1 wherein the step of decoding includes the steps of:
   sampling a portion of the one symbol corresponding to the encoded bits; and
   performing a discrete Fourier transform on the encoded bits.

6. The method according to claim 1 further including the steps of decoding the at least one subsequent data symbol using a fast Fourier transform and a Viterbi decoding process.

7. The method according to claim 1 further including, prior to the step of locating the one symbol, the step of setting an initial gain based upon at least one power estimation algorithm applied to a plurality of training symbols within the packet which precede the one symbol.

8. The method according to claim 1 wherein the encoding bits provide data rate information.

9. The method according to claim 1 wherein the encoding bits data provide modulation type information.

10. The method according to claim 1 wherein the encoding bits provide data rate information and modulation type information.

11. The method according to claim 1 wherein there are a plurality of other symbols and a plurality of corresponding guard intervals between the one symbol and the subsequent data symbol.

12. The method according to claim 1 wherein data symbols that are subsequent to the at least one subsequent data symbol and which are part of the same packet are amplified with the appropriate gain.

13. The method according to claim 1 wherein the step of decoding is performed on multi-carrier modulated Binary Phase Shift Keying (BPSK) encoded bits and the step of decoding includes the steps of sampling the multi-cater modulated BPSK encoded bits:
performing a discrete Fourier transform on the BPSK encoded bits to obtain transformed encoded bits;
determining the phase of the BPSK encoded bits based upon the transformed encoded bits; and
identifying the encoding of the subsequent data signal based upon the determined phase of the BPSK encoded bits.

14. The method according to claim 13 wherein the step of identifying is implemented using a lookup table populated with maximum likelihood values.

15. The method according to claim 13 further including the steps of decoding the at least one subsequent data symbol using a fast Fourier transform and a Viterbi decoding process.

16. The method according to claim 13 wherein the step of performing the discrete Fourier transform performs the discrete Fourier transform on only the encoded bits.

17. The method according to claim 16 wherein the encoded bits, when received at the receiver, are spread at non-adjacent frequency bins.

18. The method according to claim 13 wherein the step of decoding further includes, prior to the step of determining the phase, the steps of:
normalizing and channel correcting the transformed encoded bits to obtain normalized and channel corrected transformed encoded bits; and
wherein the step of determining the phase of the BPSK encoded bits is based upon the normalized and channel corrected transformed encoded bits.

19. The method according to claim 18 further including the steps of decoding the at least one subsequent data symbol using a fast Fourier transform and a Viterbi decoding process.

20. The method according to claim 1 wherein:
the one symbol and at least one subsequent data symbols are separated by a guard interval; and
the step of setting the gain takes place during the guard interval.

21. The method according to claim 20 wherein the step of decoding decodes only the encoding bits within the one symbol.

22. The method according to claim 20 wherein the step of locating the one symbol comprises the steps of:

searching for an endpoint of a cyclic pattern of training symbols within the received data packet which precede the one symbol; and
waiting a predetermined period of time after the endpoint.

23. The method according to claim 20 wherein the step of decoding includes the steps of:
sampling a portion of the one symbol corresponding to the encoded bits; and
performing a discrete Fourier transform on the encoded bits.

24. The method according to claim 20 further including the steps of decoding the at least one subsequent data symbol using a fast Fourier transform and a Viterbi decoding process.

25. The method according to claim 20 further including, prior to the step of locating the one symbol, the step of setting an initial gain based upon at least one power estimation algorithm applied to a plurality of training symbols within the packet which precede the one symbol.

26. The method according to claim 20 wherein the encoding bits provide data rate information.

27. The method according to claim 20 wherein the encoding bits data provide modulation type information.

28. The method according to claim 20 wherein the encoding bits provide data rate information and modulation type information.

29. The method according to claim 20 wherein the step of decoding is performed on multi-carrier modulated BPSK encoded bits and the step of decoding includes the steps of
sampling the multi-carrier modulated BPSK encoded bits;
performing a discrete Fourier transform on the BPSK encoded bits to obtain transformed encoded bits;
determining the phase of the BPSK encoded bits based upon the transformed encoded bits; and
identifying the encoding of the subsequent data signal based upon the determined phase of the BPSK encoded bits.

30. The method according to claim 29 wherein the step of identifying is implemented using a lookup table populated with maximum likelihood values.

31. The method according to claim 29 further including the steps of decoding the at least one subsequent data symbol using a fast Fourier transform and a Viterbi decoding process.

32. The method according to claim 29 wherein the step of performing the discrete Fourier transform performs the discrete Fourier transform on only the encoded bits.

33. The method according to claim 32 wherein the encoded bits, when received at the receiver, are spread at non-adjacent frequency bins.

34. The method according to claim 29 wherein the step of decoding further includes, prior to the step of determining the phase, the steps of:
normalizing and channel correcting the transformed encoded bits to obtain normalized and channel corrected transformed encoded bits; and
wherein the step of determining the phase of the BPSK encoded bits is based upon the normalized and channel corrected transformed encoded bits.

35. The method according to claim 34 further including the steps of decoding the at least one subsequent data symbol using a fast Fourier transform and a Viterbi decoding process.

36. A method of changing the gain of a receive path amplifier that operates upon a received data packet containing a plurality of symbols, at least one symbol having a first type of encoding and including encoding bits identifying one of a plurality of second type of encodings and at least one subsequent data symbol encoded in a manner corresponding to the one identified second type of encoding, the method comprising the steps of:

amplifying the received one symbol with a first gain corresponding to the first type of encoding using the receive path amplifier;

locating the amplified one symbol;

decoding the encoding bits of the one symbol to identify the one of the plurality of identified second type of encodings;

changing the gain of the receive path amplifier, during a single guard interval that occurs between the at least one symbol and the at least one subsequent data symbol, to a second gain corresponding to the one identified second type of encoding; and     amplifying the received at least one subsequent data symbol with the second gain using the receive path amplifier.

37. The method according to claim 36 wherein the first type of encoding is Binary Phase Shift Keying (BPSK) and the plurality of second types of encodings include different sizes of quadrature amplitude modulation constellations.

38. The method according to claim 36 wherein the first type of encoding is at a first data rate and the one of the plurality of identified second type of encodings is at a second data rate different from the first data rate.

39. The method according to claim 38 wherein the second data rate is faster than the first data rate.

40. The method according to claim 36 wherein the first type of encoding is of a first modulation type and the second type of encoding is a second modulation type that is different from the first modulation type.

41. The method according to claim 36 wherein the first type of encoding is at a first data rate and the one of the plurality of identified second type of encodings is at a second data rate different from the first data rate.

42. The method according to claim 41 wherein the second data rate is faster than the first data rate.

43. The method according to claim 36 wherein the step of decoding decodes less than all bits that make up the one symbol.

44. The method according to claim 43 wherein the step of decoding decodes only the encoding bits within the one symbol.

45. The method according to claim 36 wherein the step of locating the one symbol comprises the steps of:

searching for an endpoint of a cyclic pattern of training symbols within the received data packet which precede the one symbol; and     waiting a predetermined period of time after the endpoint.

46. The method according to claim 36 wherein the step of decoding includes the steps of:

sampling a portion of the one symbol corresponding to the encoded bits; and     performing a discrete Fourier transform on the encoded bits.

47. The method according to claim 36 wherein the step of decoding is performed on multi-carrier modulated Binary Phase Shift Keying (BPSK) encoded bits and the step of decoding includes the steps of     sampling the multi-carrier modulated BPSK encoded bits;

performing a discrete Fourier transform on the BPSK encoded bits to obtain transformed encoded bits;

determining the phase of the BPSK encoded bits based upon the transformed encoded bits; and     identifying the encoding of the subsequent data signal based upon the determined phase of the BPSK encoded bits.

48. The method according to claim 47 wherein the step of identifying is implemented using a lookup table populated with maximum likelihood values.

49. The method according to claim 47 wherein the step of performing the discrete Fourier transform performs the discrete Fourier transform on only the encoded bits.

50. The method according to claim 49 wherein the encoded bits, when received at the receiver, are spread at non-adjacent frequency bins.

51. The method according to claim 47 wherein the step of decoding further includes, prior to the step of determining the phase, the steps of:

normalizing and channel correcting the transformed encoded bits to obtain normalized and equalized transformed encoded bits; and     wherein the step of determining the phase of the BPSK encoded bits is based upon the normalized and channel corrected transformed encoded bits.

52. The method according to claim 51 further including the steps of decoding the at least one subsequent data symbol using a fast Fourier transform and a Viterbi decoding process.

53. The method according to claim 36 further including the steps of decoding the at least one subsequent data symbol using a fast Fourier transform and a Viterbi decoding process.

54. The method according to claim 36 further including, prior to the step of locating the one symbol, the step of setting an initial gain based upon at least one power estimation algorithm applied to a plurality of training symbols within the packet which precede the one symbol.

55. The method according to claim 36 wherein the encoding bits provide data raw information.

56. The method according to claim 36 wherein the encoding bits data provide modulation type information.

57. The method according to claim 36 wherein the encoding bits provide data rate information and modulation type information.

58. A receiver apparatus that receives a packet containing a plurality of symbols, at least one of the symbols including encoding bits disposed therein and at least one subsequent data symbol encoded in a manner corresponding to the encoding bits of the symbol, the receiver comprising:

a variable gain amplification circuit that amplifies each symbol in the packet with a determined gain;

a first decoder capable of decoding the encoding bits within the symbol;

a gain determination circuit which, based upon the decoded encoding bits, determines an appropriate gain for the at least one subsequent data symbol and causes the determined gain to be the appropriate gain for the at least one subsequent data symbol; and     a second decoder different from the first decoder that is capable of decoding the at least one subsequent data symbol.

59. The apparatus according to claim 58 wherein the first decoder is only capable of decoding the encoding bits within the symbol.

60. The apparatus according to claim 58 wherein the at least one symbol and the at least one subsequent data symbol are separated by only a single guard interval and wherein the cain determination circuit determines the appropriate gain during the single guard interval.

61. The apparatus according to claim 60 wherein both the first and second decoders receive timing signals from a symbol dining circuit.

62. The apparatus according to claim 60 wherein the first decoder includes a discrete Fourier transform circuit, a channel correction circuit, a slicing circuit and a table lookup decoding circuit.

63. The apparatus according to claim 62 wherein the second decoder includes a fast Fourier transform circuit, a channel estimation circuit a demapping and deinterleaving circuit and a Viterbi decoder.

64. The apparatus according to claim 63 further including an amplitude tracking circuit tat determines the magnitude of the received signal, which magnitude is used by the channel estimation circuit to scale the channel estimate for at least the at least one subsequent data symbol.

65. The apparatus according to claim 58 wherein the first decoder includes a discrete Fourier transform circuit, a channel correction circuit, a slicing circuit and a table lookup decoding circuit.

66. The apparatus according to claim 65 wherein the second decoder includes a fast Fourier transform circuit, a channel estimation circuit, a demapping and deinterleaving circuit and a Viterbi decoder.

67. The apparatus according to claim 66 further including an amplitude tracking circuit that determines the magnitude of the received signal, which magnitude is used by the channel estimation circuit to scale the channel estimate for at least the at least one subsequent data symbol.

68. A receiver apparatus that receives a packet containing a plurality of symbols, at least one of the symbols including encoding bits disposed therein and at least one subsequent data symbol encoded in a manner corresponding to the encoding bits of the symbol, the receiver comprising:
a variable gain amplifier that amplifies each symbol in the packet with a determined gain;
a decoder capable of decoding the encoding bits within the one symbol prior to the arrival of the at least one subsequent data symbol and capable of decoding the at least one subsequent data symbol, wherein the encoding bits include less than all bits that make up the one symbol; and
a gain determination circuit which, based upon the decoded encoding bits, determines an appropriate gain for the at least one subsequent data symbol and causes the determined gain to be the appropriate gain for the at least one subsequent data symbol.

69. A receiver apparatus that receives a packet containing a plurality of symbols, at least one of the symbols including a symbol with encoding bits disposed therein and at least one subsequent data symbol encoded in a manner corresponding to the encoding bits of the symbol, the receiver comprising:
means for amplifying each symbol in the packet with a determined gain;
means for decoding the encoding bits within the symbol and the at least one subsequent data symbol, wherein the encoding bits include less than all bits that make up the one symbol;
means for determining an appropriate gain for the at least one subsequent data symbol; and
means for causing the determined gain to be the appropriate gain for the at least one subsequent data symbol.

70. The apparatus according to claim 69 wherein the means for decoding includes a first decoder for decoding the encoding bits and a second decoder for decoding the at least one subsequent data symbol.

71. The apparatus according to claim 70 wherein the at least one symbol and the at least one subsequent data symbol are separated by only a single guard interval and wherein the means for determining an appropriate gain determines the appropriate gain during the single guard interval.

72. The apparatus according to claim 69 wherein the means for decoding includes a decoder that decodes both the encoding bits and the at least one subsequent data symbol.

73. The apparatus according to claim 72 wherein the at least one symbol and the at least one subsequent data symbol are separated by only a single guard interval and wherein the means for determining an appropriate gain determines the appropriate gain during the single guard interval.

74. A method of adjusting the gain of a variable gain amplifier in a receive path of a receiver that is applied to a received packet containing a plurality of symbols, including a plurality of training symbols, a data identifying symbol, at least one subsequent data symbol, and a guard interval disposed between the data identifying symbol and the at least one subsequent data symbol, comprising the steps of:
determining an initial gain based upon training symbols;
determining an updated gain based upon decoding of at least a portion of the data identifying symbol; and
applying the updated gain to the variable gain amplifier prior to the end of the guard interval.

75. A method according to claim 74 wherein the guard interval is the only guard interval between the data identifying symbol and the at least one subsequent data symbol.

76. A method of changing the gain of a receive path amplifier in a digital receiver that operates upon a received data packet containing first and second pluralities of symbols, the first plurality of the symbols including encoding bits disposed therein and the second plurality of symbols including a first subsequent data symbol encoded in a manner corresponding to the encoding bits, the method comprising the steps of:
locating each of the first plurality of symbols, wherein a last symbol of the first plurality of symbols and the first subsequent data symbol are separated by a guard interval;
decoding the encoding bits within each of the first plurality of symbols;
setting the gain of the receive path amplifier, during the guard interval, to correspond to an appropriate gain that is determined in part based upon the encoding bits; and
amplifying the second plurality of symbols, including the first subsequent data symbol with the appropriate gain.

77. The method according to claim 76 further including, prior to the step of locating the one symbol, the step of setting an initial gain based upon at least one power estimation algorithm applied to a plurality of training symbols within the packet which precede the one symbol.

78. The method according to claim 76 wherein the encoding bits provide data rate information.

79. The method according to claim 76 wherein the encoding bits data provide modulation type information.

80. The method according to claim 76 wherein the encoding bits provide data rate information and modulation type information.

* * * * *